(12) United States Patent
Luna et al.

(10) Patent No.: US 6,404,228 B1
(45) Date of Patent: Jun. 11, 2002

(54) APPARATUS FOR TRANSLATING DIGITAL SIGNALS

(76) Inventors: Ralph T. Luna, 6840 N. Tulane Ave., Moorpark, CA (US) 93021; Lloyd F. Linder, 3730 Patrick Henry, Agoura Hills, CA (US) 91301; Erick M. Hirata, 21917 Ocean Ave., Torrance, CA (US) 90303

( * ) Notice: Subject to any disclaimer, the term of this patent is extended or adjusted under 35 U.S.C. 154(b) by 0 days.

(21) Appl. No.: 09/005,411

(22) Filed: Jan. 9, 1998

(51) Int. Cl.[7] .................... H03K 19/0175; H03K 19/02
(52) U.S. Cl. ............................................ 326/66; 326/56
(58) Field of Search ........................ 326/62–64, 66–69, 326/73–75, 77, 78, 56, 81

(56) References Cited

U.S. PATENT DOCUMENTS

| | | | | |
|---|---|---|---|---|
| 5,293,081 A | * | 3/1994 | Chiao et al. ................ | 327/108 |
| 5,705,940 A | * | 1/1998 | Newman et al. ............. | 326/68 |
| 5,877,632 A | * | 3/1999 | Goetting et al. ............. | 326/50 |

FOREIGN PATENT DOCUMENTS

| | | | | |
|---|---|---|---|---|
| JP | 406132810 | * | 5/1994 | .................. 326/63 |

* cited by examiner

Primary Examiner—Patrick Wamsley
Assistant Examiner—James H Cho

(57) ABSTRACT

An apparatus for selectably converting emitter-coupled logic (ECL) and positive emitter-coupled logic (PECL) signals to negative complimentary metal oxide semiconductor (NCMOS) signals is disclosed. The apparatus uses an input level shifter, a secondary level shifter, and an output buffer to convert the ECL and PECL differential signals to single-ended signals. The apparatus also includes a disable output function for disabling the output of the output buffer. The apparatus may be integrated multiple times on a substrate containing NCMOS circuitry, thereby allowing the NCMOS circuitry to be driven by differential signals. Alternatively, the present invention may be integrated multiple times onto a single substrate to create a dedicated universal translator.

6 Claims, 5 Drawing Sheets

APPARATUS FOR TRANSLATING DIGITAL SIGNALS

BACKGROUND OF THE INVENTION (a) Field of the Invention

The present invention relates in general to digital signals and, more particularly to an apparatus for translating digital signals from one format to another format.

(b) Description of Related Art

Various types of digital signals and circuitry are used in industry. These signals and circuitry can be grouped into single-ended or differential formats. To convey one bit of information, single-ended signals require a single output that is referenced to ground. A typical example of a single-ended signal format includes a complimentary metal-oxide semiconductor (CMOS) signal format. Typical voltage values for CMOS signals are $Vin_{low}=0$ V and $Vin_{high}=5$ V. Alternatively, there is another format of CMOS circuitry referred to as NCMOS. NCMOS is an acronym for negative CMOS, a format identical to CMOS except that it operates on a negative voltage supply. The signals for NCMOS are typically $Vin_{low}=-5$ V and $Vin_{high}=0$ V. Another common form of single-ended signals is transistor-transistor logic (TTL). TTL signals range from $Vin_{low}=0.7$ V to $Vin_{high}=3.5$ V. CMOS, NCMOS, and TTL circuitry offer the advantages of low power consumption and high circuit density.

Differential digital signal formats include emitter-coupled logic (ECL) and positive emitter-coupled logic (PECL). Differential signals generally include a true component and a false component. The true component is representative of the data bit to be conveyed, and the false component is the compliment of the data bit to be conveyed. Differential signals have meaning only when both components are examined together. Typical true and false voltage levels for ECL are $Vin_{low}=-1.8$ V and $Vin_{high}=-1$V. PECL true and false voltage levels are typically $Vin_{low}=3.5$ V and $Vin_{high}=4.2$ V.

When an ECL signal is "high" the true component will be approximately −1V and the false component will be approximately −1.8 V. Differential signals offer the advantage of high noise immunity.

Due to their distinct advantages, single-ended and differential signals, and their associated circuitry, are used in wide ranges of industrial applications. However, since the two signal formats are not readily compatible, it is not possible to connect a differential output directly to a single-ended NCMOS input. For example, it may be desirable to use differential signals (i.e., ECL or PECL) in an electromagnetically noisy environment such as a circuit board. However, most digital integrated circuits in use today are adapted to receive single-ended input signals, such as NCMOS signals. It is not possible to interface the differential signals directly to the single-ended inputs without the use of a translator circuit. Additionally, it is commonly known in industry to use both NCMOS and TTL signals. However, the two signal formats, although both single ended, are not compatible with one another due to voltage level differences.

Known translator circuits, such as Texas Instruments AM26LS32 and AM26LS33 differential line receivers, convert ECL or PECL signals to single-ended TTL outputs. However, these known translator circuits do not selectably translate both ECL and PECL to single-ended NCMOS signals, nor do they convert TTL signals to NCMOS signals.

SUMMARY OF THE INVENTION

The present invention is embodied in an apparatus for converting an input signal of a first format to an output signal of a second format. The converting apparatus includes an input level shifter that receives the input signal, wherein the input signal includes an emitter-coupled logic (ECL) signal, a positive emitter-coupled logic (PECL) signal, or a transistor-transistor logic (TTL) signal. The input level shifter is programmable by a selector input, wherein the selector input programs the input level shifter to shift the input signal to produce a differential signal. The apparatus further includes a secondary level shifter that converts the differential signal to a single-ended signal, along with an output buffer that converts the single-ended signal into a negative complimentary metal oxide semiconductor (NCMOS) signal, wherein the NCMOS signal is the output signal.

The invention itself, together with further objects and attendant advantages, will best be understood by reference to the following detailed description, taken in conjunction with the accompanying drawings.

DESCRIPTION OF THE PREFERRED EMBODIMENTS

The present invention is an apparatus for selectably converting emitter-coupled logic (ECL) and positive emitter-coupled logic (PECL) signals to negative complimentary metal oxide semiconductor (NCMOS) signals. Additionally, the apparatus of the present invention is capable of converting transistor-transistor logic (TTL) signals to NCMOS signals. The present invention may be integrated multiple times on a substrate having an NCMOS circuit. This configuration allows the NCMOS circuit to be driven by ECL or PECL inputs. Alternatively, the present invention may be integrated multiple times on a dedicated substrate to create a component for selective conversion of ECL and PECL signals to NCMOS signals. For example, the present invention may be integrated sixteen times on a single substrate to create a "hex translator" to interface between the ECL or PECL circuitry and NCMOS circuitry.

Figure 1:
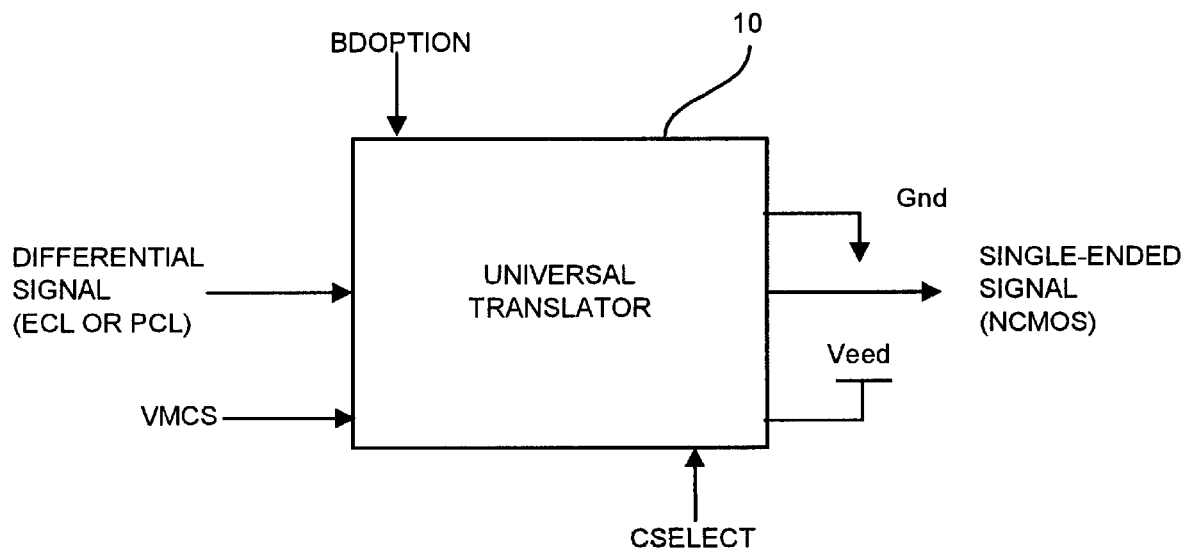
FIG. 1 is a block diagram of a circuit embodying the present invention.

Referring now to FIG. 1, a block diagram of a circuit 10 embodying the present invention is shown. The circuit 10 is referred to herein as a universal translator 10, which converts differential signals (i.e., ECL or PECL) to single-ended signals (i.e., NCMOS). The translator 10 also converts TTL signals to NCMOS signals. The translator 10 has power (Veed) and ground (Gnd) connections that provide power and ground to various components within the translator 10. In addition to the Veed and Gnd connections, the translator also has a VMCS input, which properly biases various components within the translator 10. The translator 10 also has control signal inputs BD-OPTION and CSELECT. The BD-OPTION and CSELECT signals are used to select the type of input the translator 10 will receive (i.e., ECL or PECL) and control the output of the translator, respectively.

The use of the BD-OPTION pin provides functional advantages. Specifically, if the present invention is integrated onto a single substrate a number of times with the BD-OPTION pin brought out to a lead on the package, the translator may be programmably used for translating to NCMOS signals. Using this configuration, the BD-OPTION pin need only be tied to +5V or ground to convert PECL or ECL signals to NCMOS. Alternatively, a programmable logic device such as a microprocessor may be used to hold the BD-OPTION pin in the correct state for proper signal conversion. In another alternative, the BD-OPTION pin could be bonded to +5V or ground when the device is packaged. This configuration provides easy to manufacture "custom" semiconductors for converting PECL and ECL.

Figure 2:
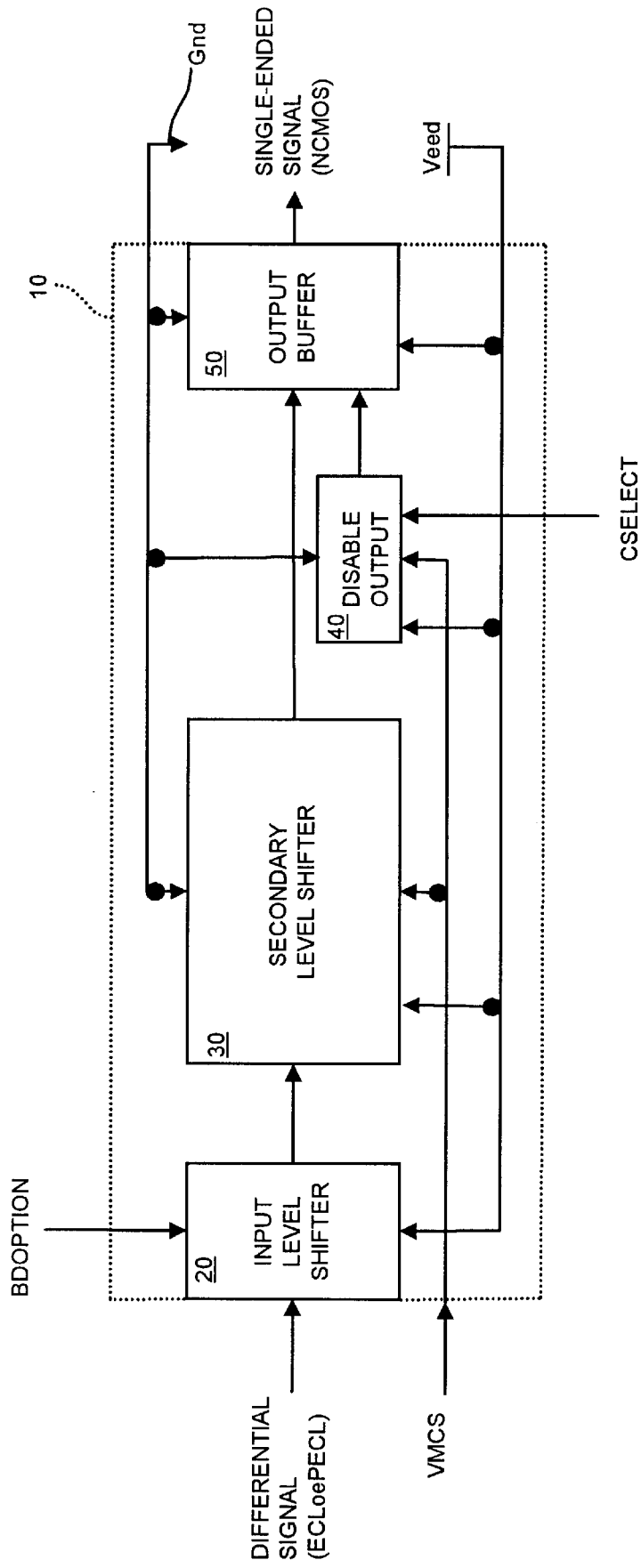
FIG. 2 is a block diagram illustrating further detail of the circuit shown in FIG. 1.

FIG. 2 is a detailed diagram showing the functional blocks of the translator 10 shown in FIG. 1. The translator 10 includes an input level shifter 20, a secondary level shifter 30, a disable output block 40, and an output buffer 50. When arranged and connected in the illustrated manner, these blocks perform the function of translating differential ECL or PECL signals or TTL signals into a single-ended NCMOS signal.

The input level shifter 20 performs the function of converting the input signals to a level suitable for use by the secondary level shifter 30. When the BD-OPTION pin is connected to a +5V supply and Veed=−5V, the input level shifter is configured to properly convert PECL signals to an appropriate level. For example, the input PECL signals which have a "high" state equal to 4.2V and a low state of 3.5V will be converted into signals that swing between approximately −400 mV and −750 mV. Like the PECL input signals, the two signals generated by the input level shifter 20 are 180° out of phase. That is, when one of the outputs from the input level shifter 20 is −400 mV the other is −750 mV.

The output signals generated by the input level shifter 20 are passed to the secondary level shifter 30. The secondary level shifter 30 converts the signals from the input level shifter 20 to signals appropriate for use by the output buffer 50. Specifically, the −400 mV and −750 mV signals are converted to a single-ended signal that ranges from a "low" of −5V to a "high" of −1.5V. The signal from the secondary level shifter 30 is coupled to the output buffer 50. The output buffer 50 switches the output of the translator 10 between a "low" of Veed (i.e., −5V) and a "high" of 0V (i.e., ground) to create a NCMOS signal. The output buffer 50 can provide enough current to drive other NCMOS circuitry that may be resident on the same chip as the translator. However, with insignificant changes, the output buffer 50 may be modified to provide sufficient current to drive off-chip components. Such modifications to the output buffer 50 are necessary if multiple translators 10 are integrated on a substrate to create a dedicated translator circuit for interfacing interface ECL or PECL circuitry to NCMOS circuitry.

The output disable circuitry 40 is controlled by the CSELECT signal and performs the function of inhibiting the output of the output buffer 50. When the output buffer 50 is inhibited, the single-ended output signal is a constant "low" (e.g., Veed). This feature is advantageous when multiple translators 10 are utilizing the same bus. Specifically, the output disable circuitry 40 allows multiple translators to be fed from the same bus without effecting the output of certain desired translators. For example, if one particular PECL bus is being used to program five NCMOS devices via five translators 10, when one of the NCMOS devices is to be reprogrammed, only its translator output will be enabled and all others disabled. Because the outputs of the other translators are not enabled, other devices that are programmed by the same bus will not be inadvertently reprogrammed.

Figure 3A:
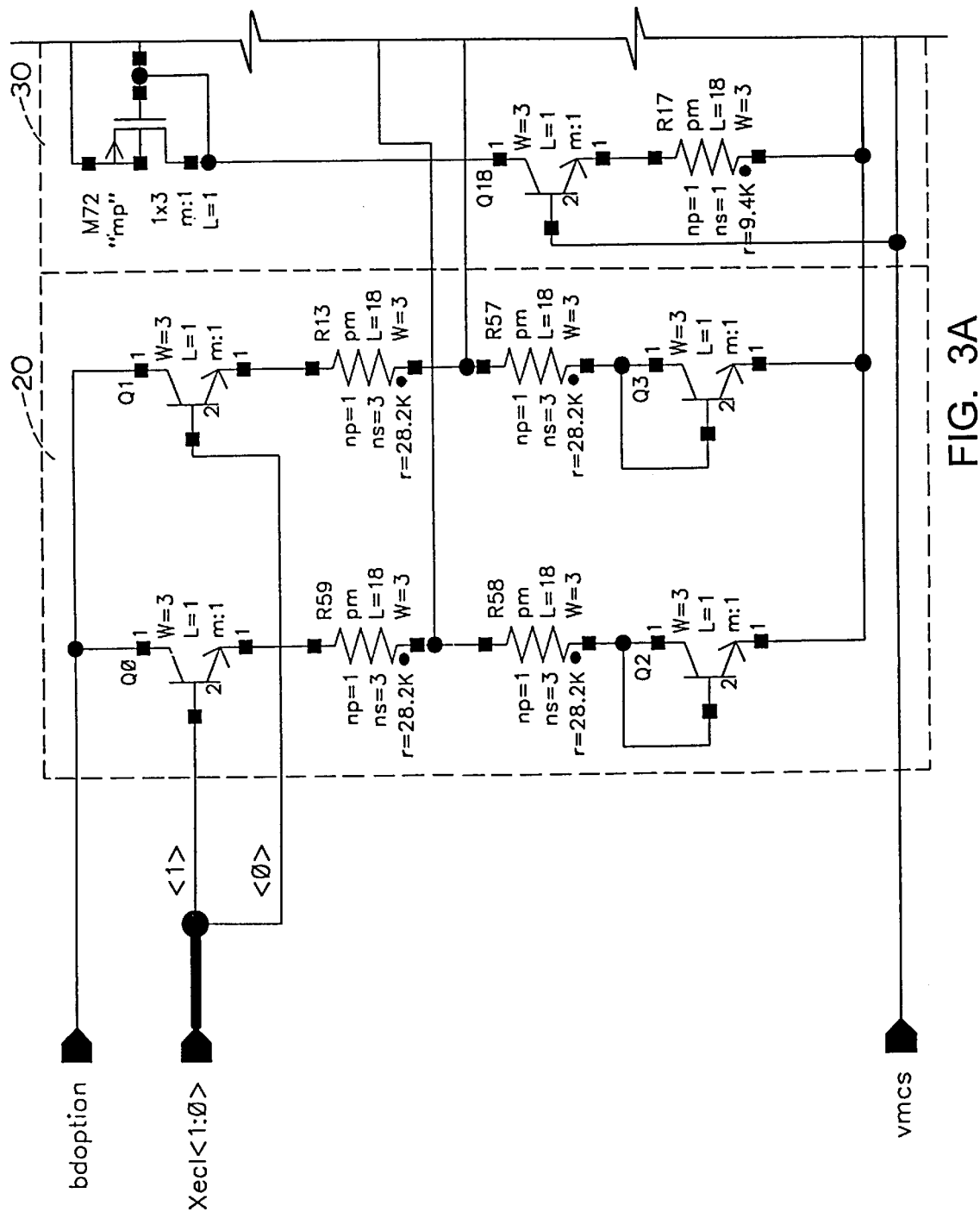
FIGS. 3A, 3B, and 3C are a schematic showing even further details of the circuit shown in FIG. 2.
Figure 3B:
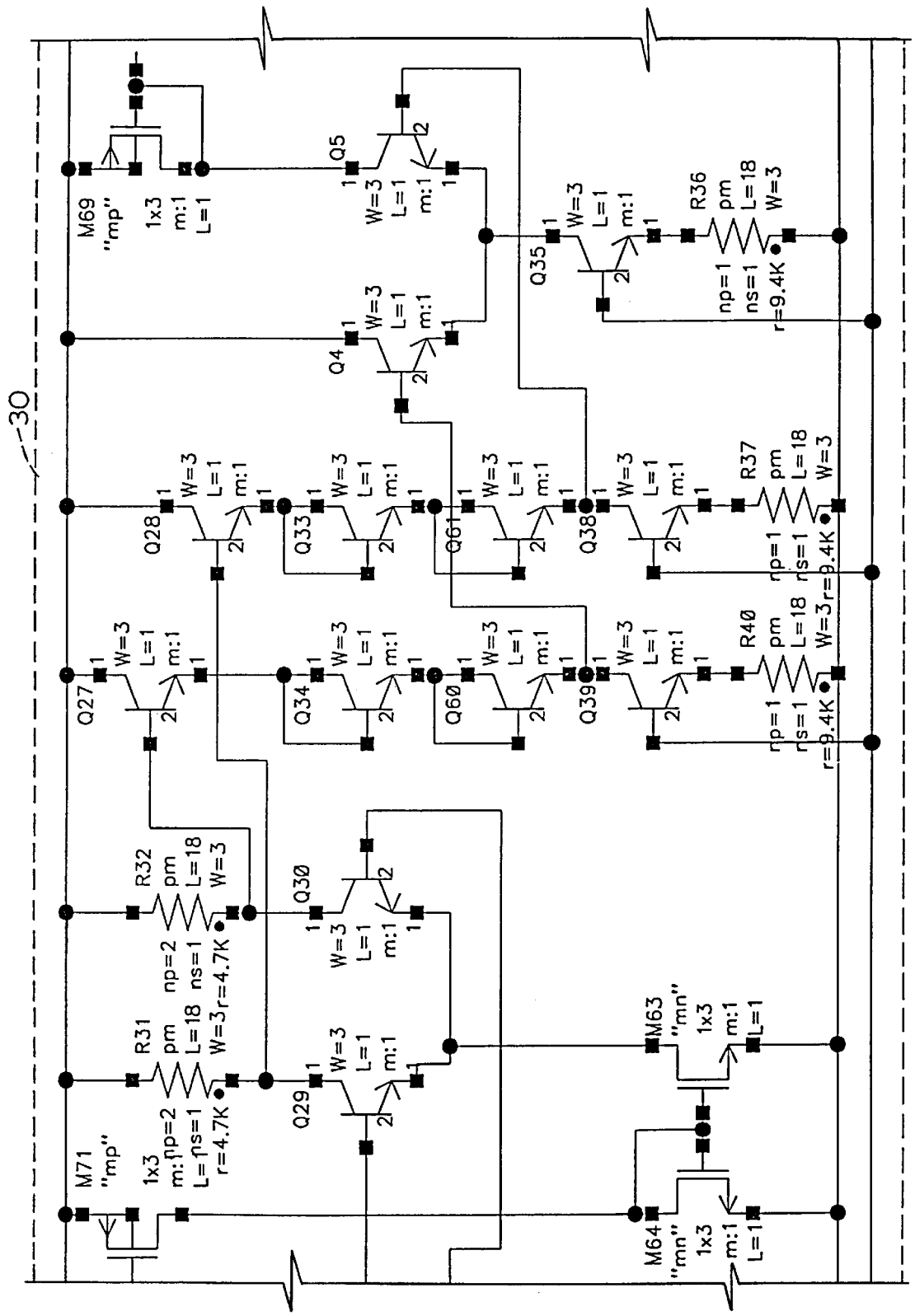
Figure 3C:
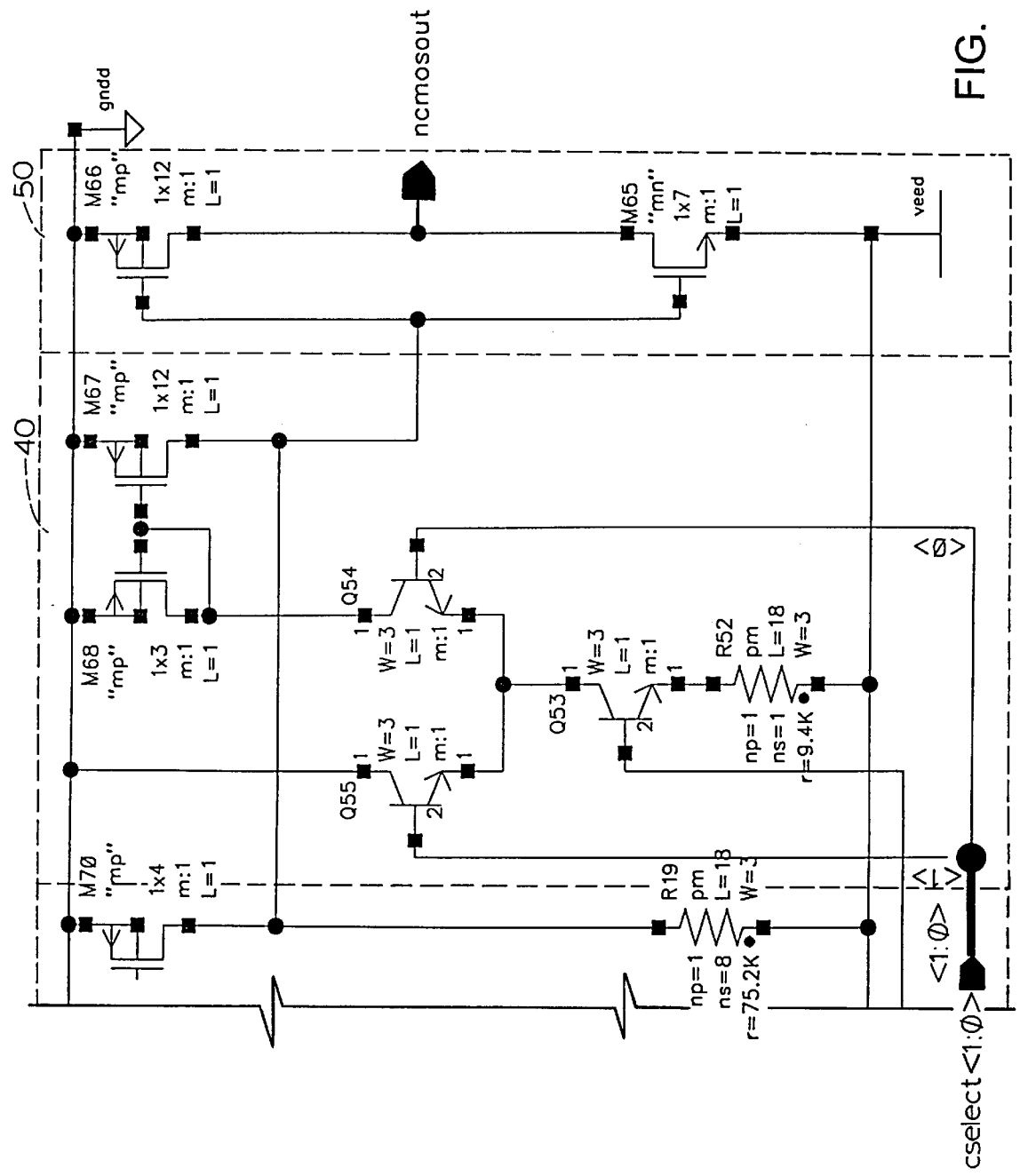

FIGS. 3A, 3B, and 3C illustrate a circuit representing a more detailed embodiment of the functional blocks shown in FIG. 2. FIGS. 3A, 3B, and 3C use the notations np and ns for resistors, which denotes a number of resistors in parallel and a 20 number of resistors in series used to make a given resistor. For the particular embodiment shown, all resistors are made from a number of 9.4K resistors in series or parallel. The selection of resistor size is design dependent. However, in a preferred embodiment, one resistor value is selected and all other resistor values are made from parallel or series combinations of that resistor value. The circuit has a PECL input signal, BD-OPTION connected to +5V, Veed connected to −5V, and VMCS connected to −3.7V. As shown in FIG. 3, block 20 performs the function of input level shifting. Signals on the Xecl true and false inputs are connected to the bases of transistors Q0 and Q1, respectively. The emitters of the transistors Q0, Q1 are each connected to two series resistors, which in turn are connected to the collectors of Q2 and Q3. Each of the bases of the transistors are coupled to their respective collectors, and the emitters are connected to Veed. This configuration sets up a step-down and divider action. Specifically, the Xecl inputs are connected to Veed through two base-emitter drops (Vbe's) and two series resistors. This configuration results in the conversion of the input PECL signals on the Xecl input to signals that range from −750 mV to −400 mV. The converted signals are passed to a group of components that form a secondary level shifter 30. Note that to convert TTL signals to NCMOS signals, the TTL signal must be coupled to the Xecl true connection, and the Xecl false pin must be connected to a 1.4V reference.

Components Q18, R17, M72, and M71 in conjunction with M64 and M63 perform the function of setting a current that will be used in the secondary level shifter 30. Specifically, Q18 is enabled because its base is connected to the VMCS input, thereby causing a current to flow through R17. M72 supplies the current that flows through R17 and M71 and M72 are connected to form a "current mirror." In other words, the same amount of current that flows through M72 will flow through M71. Likewise, the current flowing through M71 will flow through M64 and will be mirrored in M63. The current flowing through M63 sets the amount of current that will flow through R31 or R32 when transistors Q29 or Q30 are enabled. The output signals from the input level shifter 20 are connected to the bases of transistors Q29 and Q30. When the transistors are enabled, current will flow through their respective collector resistors (R31 or R32), thereby pulling the collector of the enabled transistor to a voltage lower than ground. The collectors of Q29 and Q30 are connected to the bases of Q28 and Q27, respectively.

The emitters of Q27 and Q28 are each connected to Q34 and Q33, respectively. Q34 and Q33 are further connected to Q60 and Q61. The configuration as shown in FIG. 3B serves to lower the input voltages to the bases of Q27 and Q28 by three Vbe voltage drops. The current flowing in each of the networks is regulated by R40, Q39 and R37, Q38. The voltage from the collectors of Q39 and Q38 are connected to the bases of Q4 and Q5, respectively. The current that is allowed to flow through either Q4 or Q5 is regulated by Q35 and R36.

When Q5 is enabled by a sufficient base voltage, current flows through the current mirror formed by M69 and M70, thereby creating a voltage across R19. The voltage created across R19 is the output of the secondary level shifter 30, which is coupled to the output buffer 50. The voltage from R19 controls the output buffer 50.

The output buffer 50 swings between ground and Veed based on the signal from the secondary level shifter 30. When the signal from the secondary level shifter 30 is "high" M65 conducts, thereby connecting Veed to the ncmosout terminal. Conversely, when the signal from the secondary level shifter 30 is "low" M66 conducts, thereby connecting ground to the ncmosout terminal.

The CSELECT input serves to enable and disable the output buffer 50. When the CSELECT true signal is low Q 54 is enabled, which in turn enables M68 and causes M67 to pull the line connected to the output buffer input 20 high, thereby disabling the output. Conversely, when the CSELECT true signal is high Q54 is disabled and the input to the output buffer 50 is controlled bu the voltage across R19.

Thus, it can be seen from the foregoing detailed description that the present invention provides several advantages. For example, the universal translator provides a way to selectably convert ECL, PECL, or TTL signals to single-ended NCMOS signals within one device. Input selection is performed through the use of a BD-OPTION pin, which may be hardwired within the invention or controlled external to the invention. Internal hardwiring of the BD-OPTION allows for easy manufacture of translators for ECL conversion and translators for PECL conversion. External control of the BD-OPTION pin provides design flexibility and the ability to change front end circuit design between ECL and PECL. The change of front end circuitry only requires the designer to change the state of the BD-OPTION pin, rather than replacing the translator itself. The universal translator may be integrated multiple times on a substrate containing NCMOS circuitry, thereby allowing the NCMOS circuitry to be driven by differential signals. Alternatively, the present invention may be integrated multiple times onto a single substrate to create a dedicated universal translator. Additionally, the present invention has the advantage of having a disable output circuit, which inhibits the output of the invention from changing regardless of the input. This feature is particularly useful when numerous integrations of the present invention are coupled to a common differential bus.

Of course, it should be understood that a range of changes and modifications can be made to the preferred embodiment described above. For example, circuit functions are not limited to the functional blocks as described. That is, it is the overall circuit functionality and not the specific functional block divisions that embody the present invention. Certain circuit functionalities that are grouped into a given functional block for descriptive purposes may be grouped into other functional blocks for descriptive or implementational purposes without departing from the scope of the present invention. It is therefore intended that the foregoing detailed description be regarded as illustrative rather than limiting and that it be understood that it is the following claims, including all equivalents, which are intended to define the scope of this invention.

What is claimed is:

1. An apparatus for converting an input signal of a first format to an output signal of a second format, said converting apparatus comprising:

an input level shifter that receives said input signal, said input signal comprising an emitter-coupled logic (ECL) signal, a positive emitter-coupled logic (PECL) signal, or a transistor-transistor logic (TTL) signal, said input level shifter configurable by a selector input, wherein said selector input configures said input level shifter to shift said input signal to produce a differential signal;

a secondary level shifter that converts said differential signal to a single-ended signal;

an output buffer that converts said single-ended signal into a negative complimentary metal oxide semiconductor (NCMOS) signal, wherein said output signal comprises said NCMOS signal.

2. The apparatus of claim 1 wherein said input level shifter converts said input signals to intermediate-level differential signals.

3. The apparatus of claim 2 wherein said secondary level shifter converts said intermediate-level differential signals to a single-ended signal.

4. The apparatus of claim 1 wherein further comprising an output disable circuit connected to said output buffer, said output disable circuit controlled by a disable signal.

5. The apparatus of claim 4 wherein said disable signal is connected to said output disable circuit by a hardwired connection.

6. The apparatus of claim 4 wherein said apparatus is integrated as one component of a large system.

* * * * *